United States Patent
Hurwitz

(10) Patent No.: US 11,125,784 B2
(45) Date of Patent: Sep. 21, 2021

(54) CORRECTING FOR A GAIN ERROR RESULTING FROM THE POSITION OF A POLE OF ZERO IN A TRANSFER FUNCTION OF A SYSTEM

(71) Applicant: Analog Devices International Unlimited Company, Limerick (IE)

(72) Inventor: Jonathan Ephraim David Hurwitz, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 266 days.

(21) Appl. No.: 16/007,551

(22) Filed: Jun. 13, 2018

(65) Prior Publication Data

US 2019/0383859 A1 Dec. 19, 2019

(51) Int. Cl.
| | | |
|---|---|---|
| *G01R 19/12* | (2006.01) | |
| *G01R 15/18* | (2006.01) | |
| *H03G 3/30* | (2006.01) | |
| *H03H 7/06* | (2006.01) | |

(52) U.S. Cl.
CPC ........... *G01R 19/12* (2013.01); *G01R 15/181* (2013.01); *H03G 3/3089* (2013.01); *H03H 7/06* (2013.01)

(58) Field of Classification Search
CPC ........ G01R 1/44; G01R 15/18; G01R 15/181; G01R 19/0092; G01R 19/12; G01R 19/32; G01R 21/14
USPC ................................. 324/127; 327/512, 513
See application file for complete search history.

(56) References Cited

U.S. PATENT DOCUMENTS

| | | | | |
|---|---|---|---|---|
| 5,534,820 A | * | 7/1996 | Tupper | H03F 1/3241 330/149 |
| 6,094,044 A | * | 7/2000 | Kustera | G01R 15/181 324/127 |
| RE36,987 E | * | 12/2000 | Tupper | H03F 1/3241 330/149 |
| 6,366,076 B1 | * | 4/2002 | Karrer | G01R 15/181 324/117 R |
| 7,024,172 B1 | * | 4/2006 | Murphy | H04B 1/30 455/313 |
| 2006/0232264 A1 | * | 10/2006 | Jurisch | G01R 15/16 324/142 |
| 2010/0131219 A1 | * | 5/2010 | Kenly | H02M 3/157 702/64 |
| 2011/0260711 A1 | * | 10/2011 | Badegruber | B23K 11/257 324/127 |
| 2011/0307208 A1 | * | 12/2011 | Graf | G01D 3/0365 702/104 |

(Continued)

FOREIGN PATENT DOCUMENTS

WO  WO-2013038176 A2  3/2013

*Primary Examiner* — Steven L Yeninas
(74) *Attorney, Agent, or Firm* — Schwegman Lundberg & Woessner, P.A.

(57) ABSTRACT

The response of a Rogowski coil based current measuring circuit is often proportional to frequency. To correct for this a low pass or integrating function is applied to the response to linearize it. The low pass filter is made from real resistors and capacitors, and tolerances in their values significantly affect the estimate of current. This disclosure relates to a way of addressing such problems. This allows consumers of electricity to have confidence in the accuracy of, for example, their electricity meter.

19 Claims, 12 Drawing Sheets

(56) References Cited

U.S. PATENT DOCUMENTS

| | | | | |
|---|---|---|---|---|
| 2012/0286769 A1* | 11/2012 | Torti | ............... | G01R 29/16 |
| | | | | 324/107 |
| 2012/0293166 A1* | 11/2012 | Lee | ............... | G01D 5/2046 |
| | | | | 324/207.17 |
| 2014/0320112 A1* | 10/2014 | Nodera | ............ | G01R 15/183 |
| | | | | 324/127 |
| 2016/0291060 A1* | 10/2016 | Wood | ............... | G01R 1/203 |

* cited by examiner

CORRECTING FOR A GAIN ERROR RESULTING FROM THE POSITION OF A POLE OF ZERO IN A TRANSFER FUNCTION OF A SYSTEM

FIELD

The present disclosure relates to an apparatus for and a method of detecting key features, such as the positions of the poles and zeros or gain at a specific frequency, in the transfer function of a signal processing apparatus and using this information to apply a correction.

BACKGROUND

It is known that signals from transducers typically need to be low pass or high pass filtered. Often the circuits are arranged such that the position of the breakpoint in the transfer function, i.e. the position of poles or zeros in the corresponding S-plane diagram, are well away from the frequencies of interest. Under such conditions process and temperature variations in relation to capacitive, resistive or inductive components tend not to be a bother in practice. However there are some classes of transducer, such as Rogowski coils where the voltage from such a transducer is directly proportional to the rate of change of magnetic field where it would be desirable to provide compensation or correction for component variation in signal processing stages. It is often desirable to linearize the frequency response of such a transducer by following it with an integrator, which is effectively a low pass filter whose pole (break point or −3 dB point are other terms that may be used) is set to a relatively low frequency, lower than the fundamental frequency of interest. In such an arrangement process and temperature variations can affect the position of the pole in the transfer function response of the low pass filter, and this can have significant effects on the measurement accuracy of, for example, a current measurement circuit comprising a combination of a current transformer and a low pass filter.

SUMMARY

According to a first aspect of the present disclosure there is provided an apparatus for estimating or correcting for a gain error resulting from component variation which may modify a position of a pole or a zero in a transfer function of a system, such as a signal processing apparatus. The signal processing apparatus may, for example, comprise a low pass filter or an integrator arranged to receive an input signal. The low pass filter or integrator may have at least one pole in its transfer function. Other filter functions or more complex filter functions may include one or more zeros in the transfer function. The apparatus further comprises a characterization circuit comprising components which are mapped to those in the filter or integrator. In this context "mapped" may mean that they are the same, or that the values are scaled in some known way. The same scaling need not be applied to each class of components. Thus, for example, capacitors in the characterization circuit may be formed to be smaller than equivalent capacitors in the filter or integrator. However the relative ratio between the sizes of the capacitors is known, as it can be set by the area allocated to a capacitor during a semiconductor/integrated circuit fabrication process. Similarly resistors in the characterization circuit need not have the same value as resistors in the filter path. It is merely sufficient that the relevant scaling factors are known and predictable. That said, there can be certain advantages if the resistors and capacitors in the filter and in the characterization circuit are the same size (value), or that at least every component in one circuit has a corresponding component of the same size in the other circuit. As a consequence of this matching or scaling there is a predictable relationship between the positions of one or more poles or one or more zeros in the transfer function of the characterization circuit and one or more poles or zeros in the transfer function of the filter.

Advantageously there is further provided a processing circuit arranged to interrogate the function of the characterization circuit and estimate the transfer function of the filter or a correction to the filter response based on the observed operation of the characterization circuit.

The characterization circuit may, for example, include an RC circuit or a plurality of RC combinations configured to form an oscillator. The frequency of the oscillator can then be monitored, for example by digitizing and then analyzing using a digital data processor, to determine the frequency of oscillation and hence the time constant of the RC circuit or circuits. As a further alternative the RC circuit may be driven with a known signal, such as a signal produced by a digital to analog converter and the output from the RC circuit may be digitized by an analog to digital converter such that the transfer function of the circuit can be accurately measured. In such an arrangement the analog to digital converter may be used to sample both the output of the characterization circuit and the input to the characterization circuit such that scaling errors in the measurement chain cancel out.

According to a second aspect of the present disclosure there is provided a method of correcting for at least one of a gain error and a phase error resulting from a position of a pole or a zero in a transfer function of a signal processing circuit, the method being implemented is a circuit comprising:

a) a first circuit arranged to process an input signal and to output a processed analog output; and b) a characterization circuit formed such that it has R, L or C components in circuits formed therein where the values of the R, L or C components of the circuits in the characterization circuit are identical to or scaled versions of corresponding R, L or C groupings in the first circuit. As a result the transfer functions of a first circuit and the characterization circuits are related in a known way.

The method comprises exercising the characterization circuit to determine key parameters, such as component values or the time constant or transfer function of the characterization circuit. The method further comprising using the estimate of the time constant or the transfer function of the characterization circuit or a component value estimate using the characterization circuit to estimate or account for a deviation of the transfer function of the signal processing circuit from a nominal transfer function, or to estimate the actual transfer function of the signal processing circuit. Where a deviation is calculated, a correction may be made available for correcting the output of the signal processing circuit.

According to a further aspect of the present disclosure there is provided a current measuring circuit comprising a Rogowski coil or an air core current transformer and a low pass RC filter. The apparatus further comprises a circuit or other suitable means for estimating a cut-off frequency of the RC filter such that the response provided by the filter at any frequency or to any input signal, such as a transient, can be accurately calculated. The current measurement circuit further comprises a second circuit comprising at least one resistor, capacitor or a resistor-capacitor combination forming an RC circuit matched to the RC filter such they share temperature and/or manufacturing process variations. The current measuring circuit further comprises an interrogation circuit for interrogating the performance of a second circuit so as to characterize the values of the R, C or the RC time constant within the second circuit. The result of the characterization can be used to calculate or modify the attenuation factor of the filter at a desired frequency, or to apply a gain and/or phase correction in a signal processing chain. In general, it is likely to be convenient to characterize a response of an RC circuit such that the individual values of R and C do not need to individually be determined. However, in some circumstances the value of a component may be sufficiently specified or known (for example because it has been calibrated or trimmed, or because it is a discrete component which is sufficiently stable and whose value is known to sufficient accuracy) such that it becomes useful to estimate the value of other components explicitly. For example, if the values of the resistors in the filter or other signal processing circuit and the characterization circuit were provided by accurate off-chip components (or has been measured) then determining the RC time constant also causes C to be accurately determined.

According to a further aspect of the present disclosure there is provided a method of estimating the magnitude of a surge event, the method comprising monitoring the evolution of voltage as a function of time of a filter, and using knowledge of the RC product to estimate the magnitude of the surge event.

The filter can be any form of filter, but for robustness will typically be a low order RC filter. The surge event may be an overvoltage event. The filter may be already connected to a conductor whose voltage is being monitored. Alternatively the filter may be connected by way of a potential divider, such as a resistor based potential divider. The filter may also be connected to, or be formed as a part of a capacitive potential divider. Such a divider may be galvanically connected to or galvanically isolated from the conductor.

The surge event may be current surge and the response of a current transducer may be filtered. The techniques discussed herein can also be used to monitor voltage surges.

In the electrical domain the teachings used here can be applied in meters, protective relays, circuit breakers, motor controllers, inverters, generators, cooling and heating systems, actuators and so on. It can also be used in arc fault detection, short circuit detection and the like.

The teachings can also be extended to mechanical and fluid systems where components have a low pass filter response to estimate transient pressure changes, load forces, fluid flows and the like.

There is further provided a surge estimator comprising a filter whose response is known to a required precision and a processor for monitoring the output of the filter as a function of time to estimate the magnitude of a surge event.

The method further comprises estimating the RC product of the RC filter. The estimate may be made using a replica circuit which can be examined to estimate the response of the filter.

BRIEF DESCRIPTION OF THE DRAWINGS

Example embodiments of the present disclosure will now be described, by way of non-limiting example only, with reference to the accompanying figures in which.

DESCRIPTION OF SOME EMBODIMENTS

Figure 1:
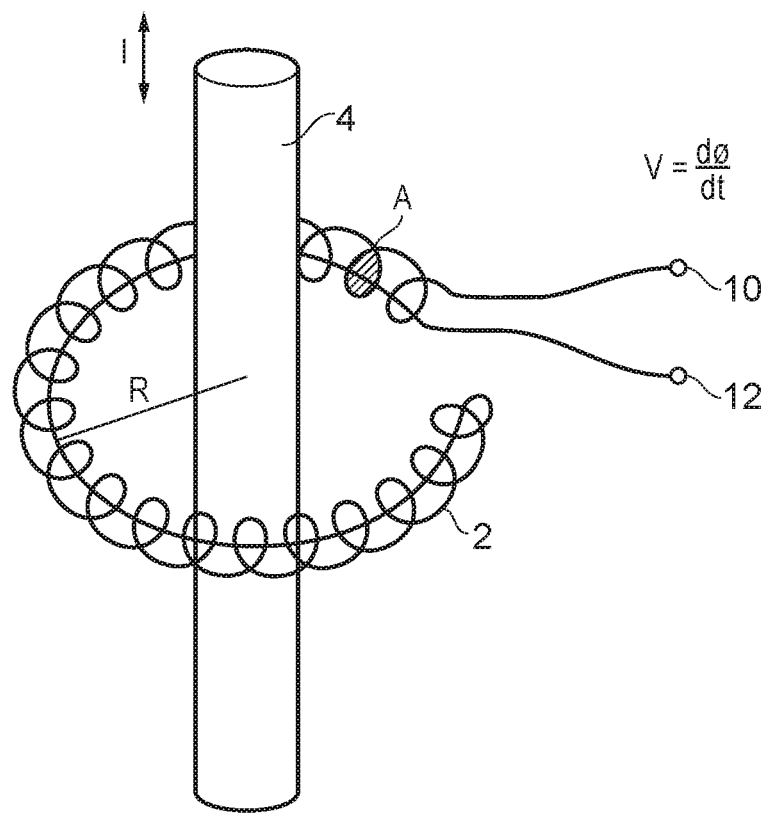
FIG. 1 schematically illustrates a Rogowski coil encircling a current carrying conductor.

FIG. 1 is a schematic illustration of the current measuring circuit in the form of a Rogowski coil 2. Such a current transducer can be used to measure a wide range of alternating currents, such as current supplied to a domestic dwelling or the currents around a distribution grid from electricity generation stations to users. The Rogowski coil comprises a coil 2 of cross sectional area A which encircles a current carrying conductor 4 which, in use, carries an alternating current I. The alternating current I in the conductor 4 induces a voltage a the output of the Rogowski coil $$V(t) = \frac{AN}{2\pi R}\mu_o \cdot \frac{dI}{dt} \qquad \text{Equation 1}$$

where

Figure 2:
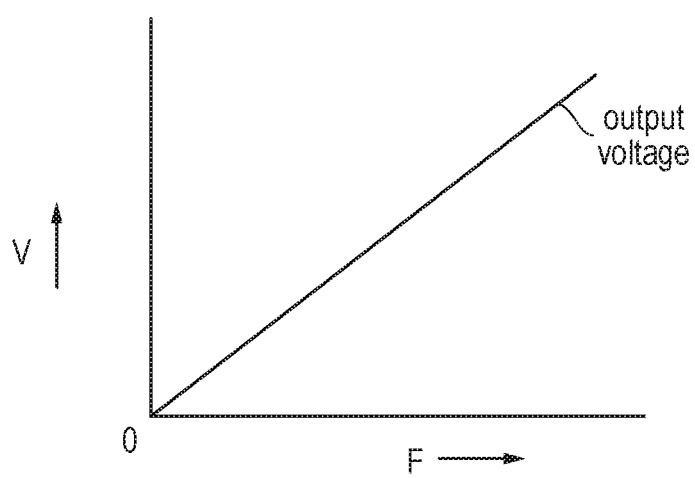
FIG. 2 is a plot of the voltage developed across a Rogowski coil as a function of frequency for a constant magnitude alternating current.

A is the cross sectional area of the coil (see FIG. 1)
N is the number of turns of the coil
R is the radius of the coil around the conductor
$\mu_o = 4\pi \times 10^{-7}$ Hm$^{-1}$
I=current A consequence of this is that if the conductor 4 were to carry an alternating current of a constant peak-to-peak or RMS value but the frequency of that current was swept from low frequency to high frequency then the voltage V developed across the Rogowski coil would increase linearly with frequency, as schematically illustrated in FIG. 2.

This property of the Rogowski coil can be unhelpful since mains born load currents are generally quite low frequency, say 50 or 60 Hz whereas noise components can be at much higher frequencies, possibly running into the hundreds of kHz or above. It can therefore be seen that such a response gives a disproportionate amount of weight to a noise signal of low magnitude but high frequency compared to a response of the desired load current having a much higher magnitude but a much lower frequency.

Ideally the output voltage of the Rogowski coil 2 would depend only on the magnitude of the current I through the conductor 4 and not on the frequency of the current.

Figure 3:
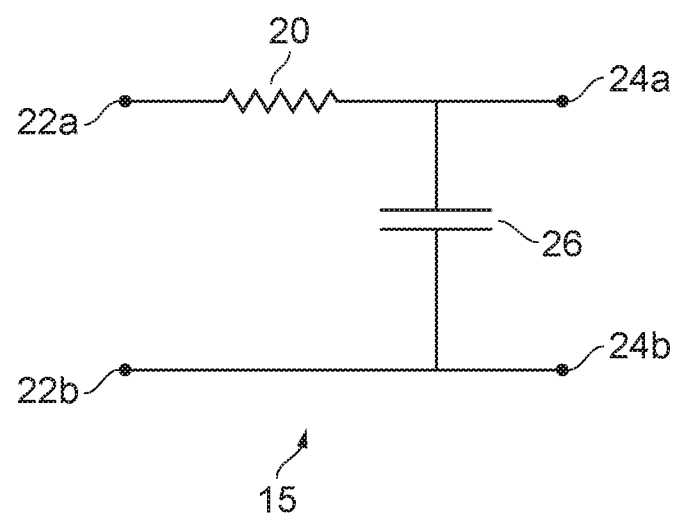
FIG. 3 is a circuit diagram of a single pole Butterworth RC filter.

The person skilled in the art is aware of low pass filters. FIG. 3 is a circuit diagram of a first order Butterworth low pass RC filter 15 comprising a resistor 20 and a capacitor 26. The filter comprises a pair of input nodes 22a and 22b and a pair of output nodes 24a and 24b. The resistor 20 extends between the input node 22a and the output node 24a. The capacitor 26 extends between the output node 24a and the conductor connecting nodes 22b and 24b.

Figure 4:
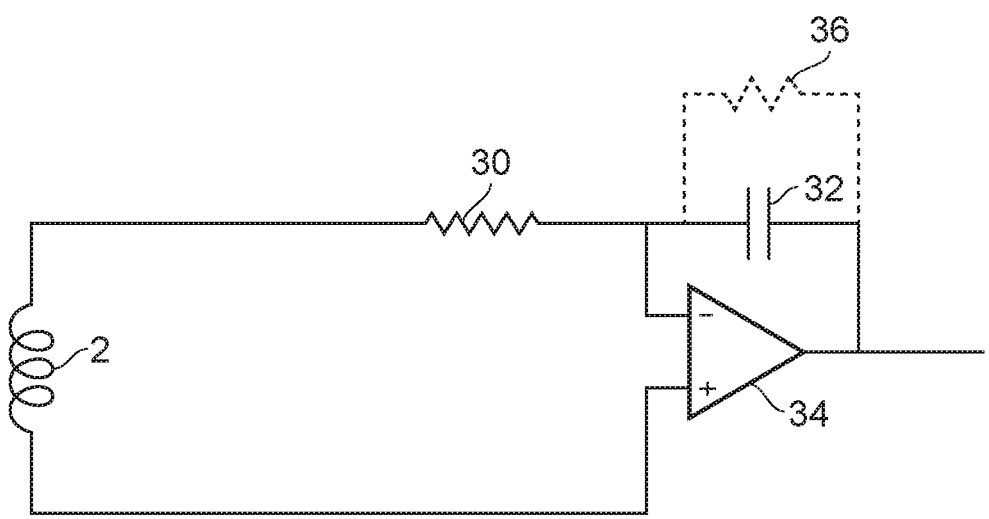
FIG. 4 is a circuit diagram of a Rogowski coil in association with and an analog integrator.

It is known that Butterworth filters can be provided in a number of "orders" and that text books show the magnitude function for an $N_{th}$ order Butterworth low pass filter as $$\frac{V_o}{V_I} = \frac{1}{\sqrt{1+\left(\frac{\omega}{\omega_C}\right)^{2n}}} \qquad \text{Equation 2}$$

where $\omega$=angular frequency
$\omega_c$=cut off frequency $2\pi f_o$
$V_O$=output voltage
$V_I$=input voltage The first order Butterworth response is an integrator-like response which can be coupled to the output of a Rogowski coil to linearize the response of such a circuit as a function of frequency. The Butterworth filter 15 is often implemented as a "leaky" integrator as shown in FIG. 4. The integrator comprises an RC filter combination formed by resistor 30 and capacitor 32 around an operational amplifier 34. In order to stop the integrator integrating endlessly and thereby risking running into its supply rails a further resistor 36 (shown in dotted line) is provided in parallel with the capacitor 32 that causes it to leak some of its charge away.

A problem with the circuit is that the magnitude of the output signal depends critically on the value of the RC product of resistor 30 and the capacitor 32. In order to understand this, consider FIG. 5 which shows an idealized response from the Rogowski coil current transducer as represented by chain line 40 which increases as function of frequency. Suppose, for example that we team this response up with a first order Butterworth filter having a cut-off frequency which is nominally $F_0$. The frequency responses are routinely represented on a log-log plot where the skilled person knows that for a first order low pass filter the frequency response falls off at 20 dB per decade. In simplistic terms, the graph is constructed such that the frequency response of the filter stays flat with zero insertion loss until the break point, and then falls at 20 dB per decade of frequency increase. We will come back to this simplification later. However, it can be seen that if process or temperature variation causes the RC product to vary such that the cut off frequency moves from $F_0$ to $F_1$ then the attenuation introduced by a filter at a given frequency decreases. For example, if we wish to measure the amplitude of a frequency at frequency $F_m$, for example 50 Hz, then the cut of frequency of $F_0$, the gain (or really the attenuation) introduced by the filter can be represented by $G_0$ at $F_m$. However, if the filter cut off frequency increases to $F_1$, then the gain of the filter increases to $G_1$ at frequency $F_m$ (or more intuitively the attenuation inserted by the filter has reduced). Similarly, if the RC components vary such that the break point decreases in frequency from $F_0$ to $F_2$ then the filter response at frequency $F_m$ is represented by gain $G_2$.

It's worth considering the effect of these numbers in detail.

Current measuring circuits often specified to a certain degree of decision. For example, a circuit may be specified to measure to within 0.1% accuracy, i.e. 1 part in 1000.

Figure 5:
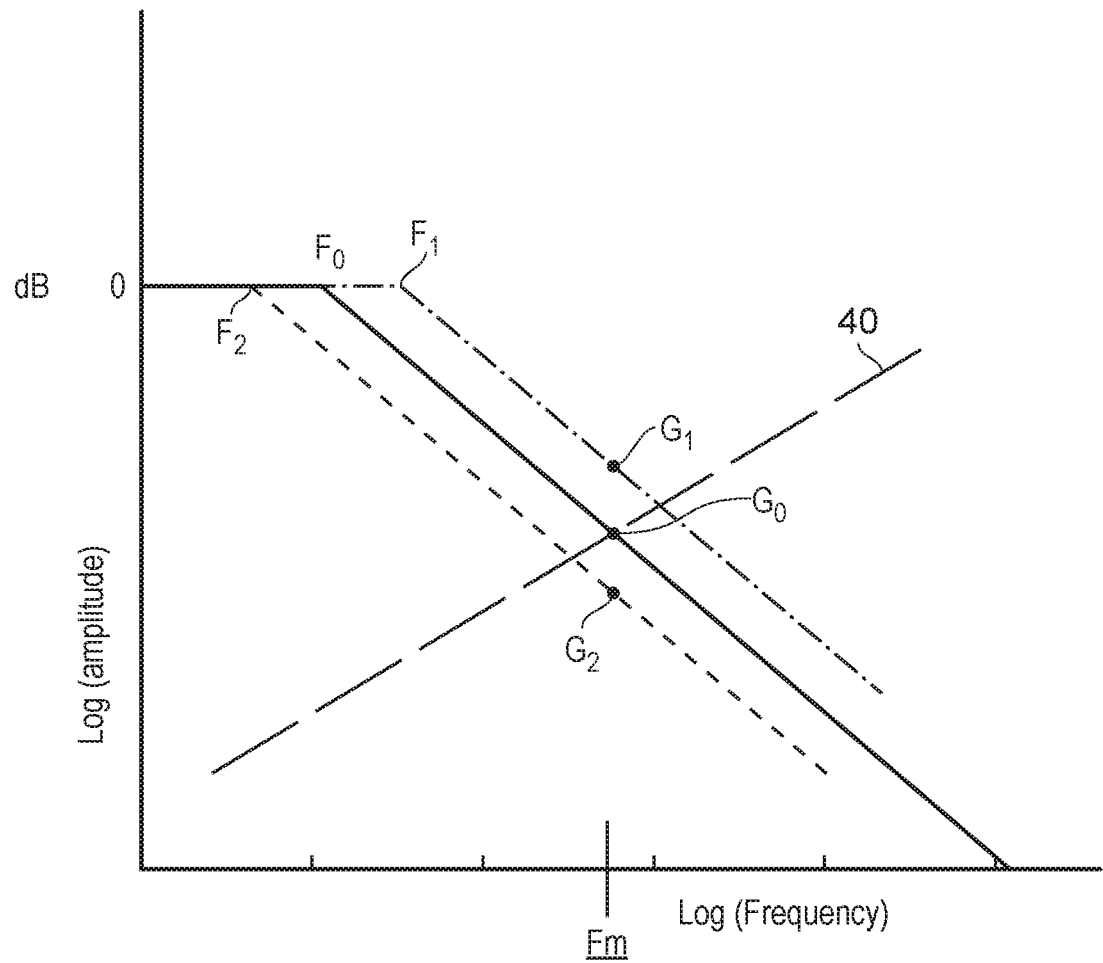
FIG. 5 is a graph illustrating how a change in the break-point (−3 dB frequency) of the filter can affect the measured amplitude of a current at a specific frequency.
Figure 6:
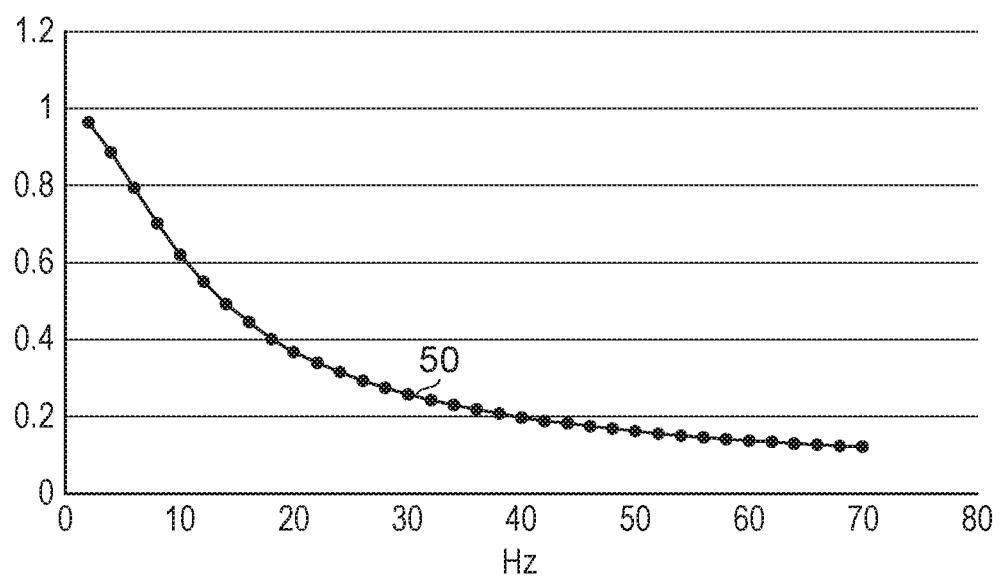
FIG. 6 is a plot of the magnitude of the filter as a function of frequency on a linear-linear scale for a filter having a cut-off frequency of 8 Hz.

If rather than using the graphical approach of the log-log plot of FIG. 5 we calculate the frequency response for a first order low pass filter and plot it on a linear-linear scale as shown in FIG. 6 by curve 50 it becomes apparent that the gradient of the filter changes more rapidly near the break-point and then changes less rapidly as the frequency moves further away from the break-point. FIG. 6 was plotted for a first order filter having a nominal break-point at 8 Hz. For such a filter the gain of the filter at 50 Hz can be calculated using Equation 2 and corresponds to 0.157991. However, if R or C were to vary such that the break point moved from 8 Hz to 9 Hz, then the gain at 50 Hz would be 0.177153. This corresponds to a change of 12% in the magnitude response of the filter at the measurement frequency. Where the resistor and capacitor components are fabricated using integrated circuit technologies, the components could be matched to great accuracy. However the absolute values of the resistor and capacitors can vary wildly from wafer to wafer, with changes of 20% or more having to be tolerated which gives rise to changes in the magnitude response of the filter much larger than the permissible measurement tolerance limit. It may be possible to calibrate at manufacture the response of the signal chain, either by trimming the components or calculating and storing a correction factor to be applied, but this may only be useful if the system remains stable forever. Furthermore, packaging stress and ambient temperature can also cause component values to change. Thus, whilst it may be possible to integrate all or part of an RC filter onto an integrated circuit it is exceptionally difficult to actually set it to a particular value without having to undertake expensive trimming. Even then, the circuit value in terms of the RC product is liable to drift with temperature. It should be noted that part of the filter may be implemented using off-chip (discrete) components.

Figure 7:
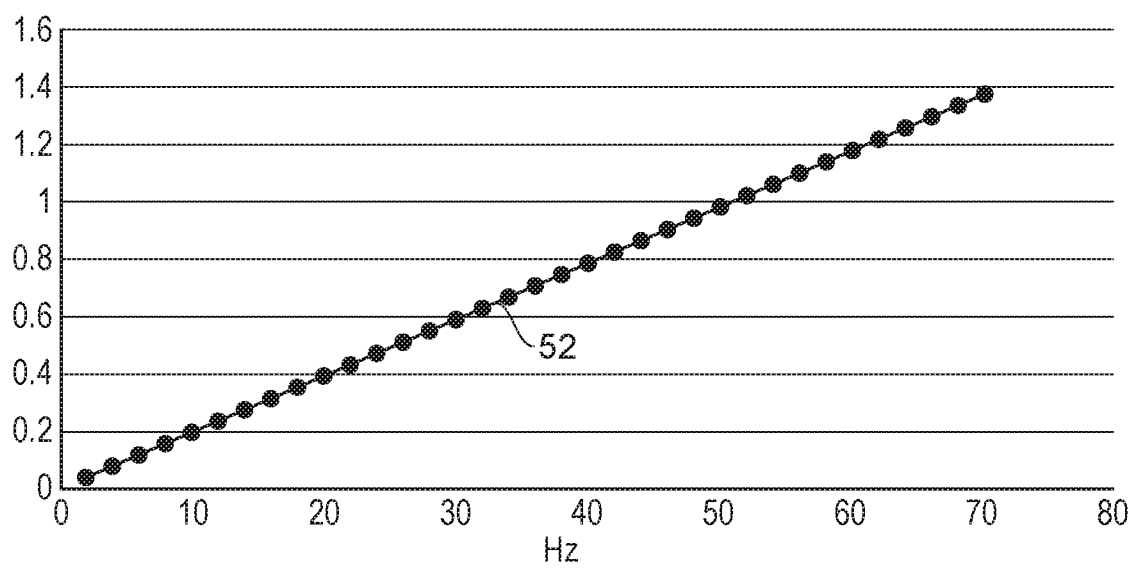
FIG. 7 is a plot of the output voltage of a Rogowski coil (in arbitrary units) on a linear-linear scale.
Figure 8:
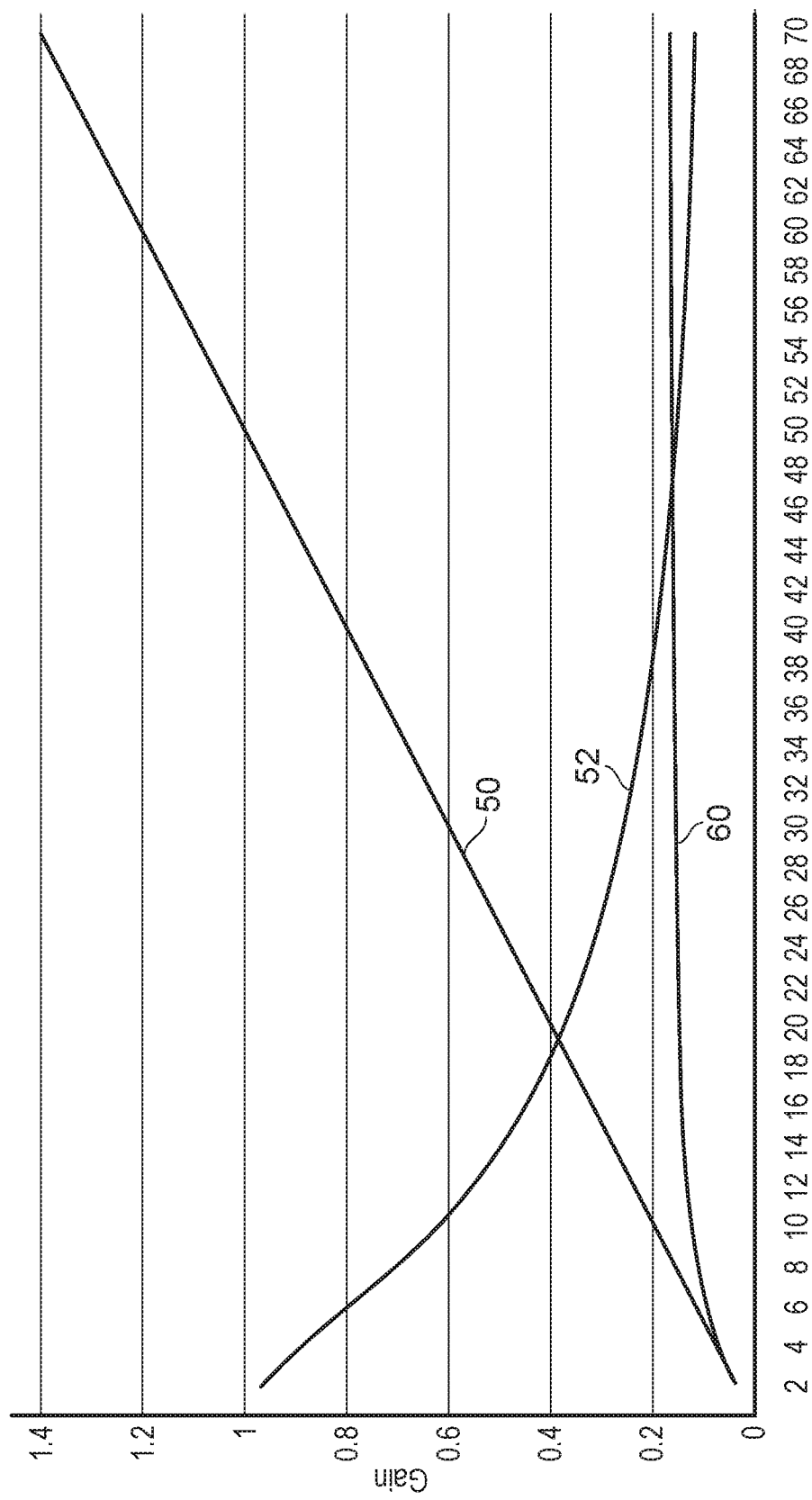
FIG. 8 is a plot combining the data shown in FIGS. 6 and 7, and showing the product thereof as a function of frequency.

FIG. 7 schematically illustrates a response of the Rogowski coil 2 as line 52 on a linear-linear scale and FIG. 8 reproduces the information of FIG. 6 and FIG. 7, and also plots their product, indicated by curve 60. It can be seen that the product 60 of the low pass filter response as represented by line 50 and the Rogowski coil response as line 52 becomes relatively constant with frequency, especially so once the frequency has moved a reasonable distance from the cut off frequency of the low pass filter.

Figure 9:
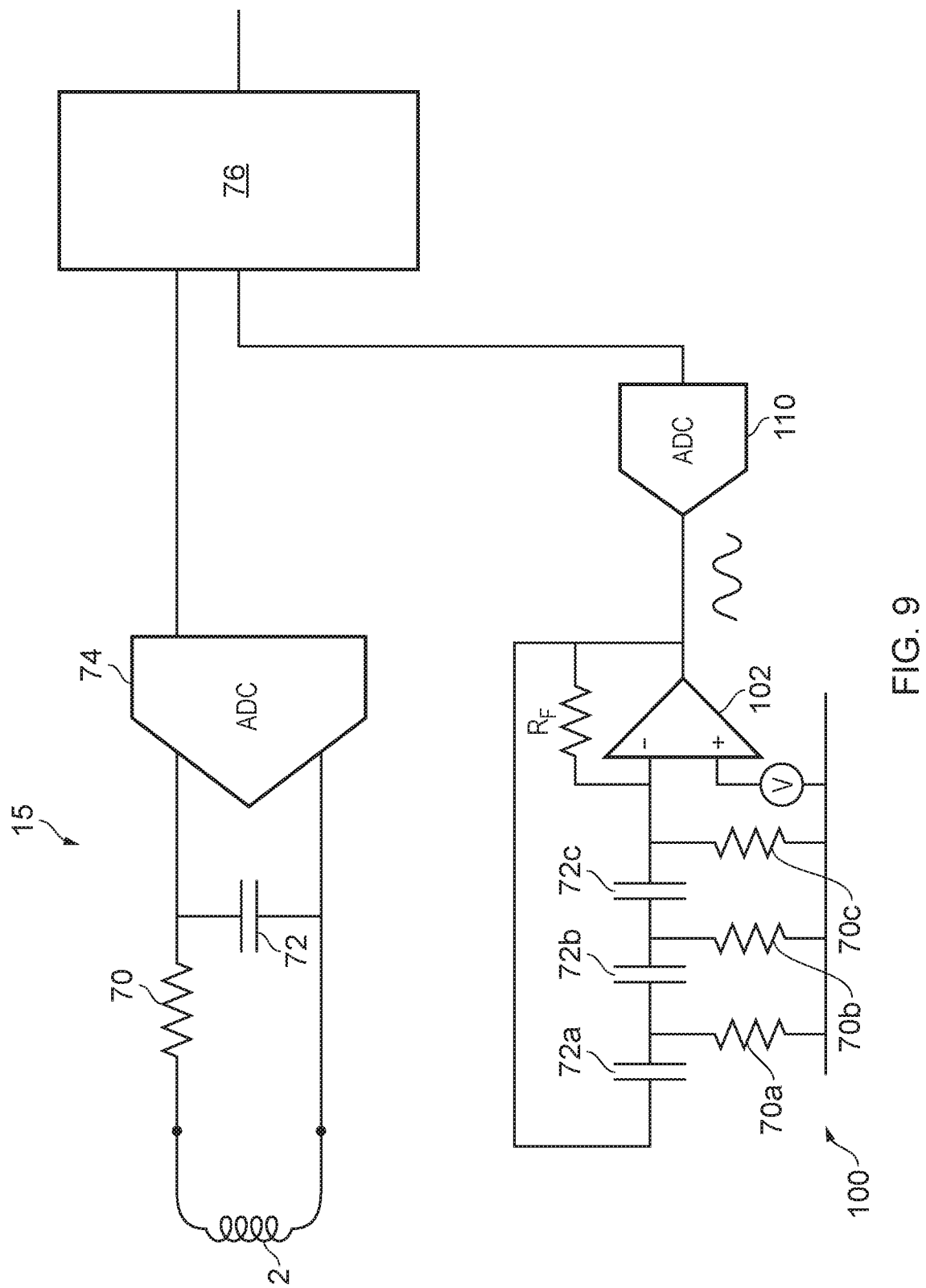
FIG. 9 shows an embodiment of an apparatus in accordance with the teachings of the present disclosure.

It can be seen that it would be desirable to be able to accurately characterize the RC product of the low pass filter. FIG. 9 schematically illustrates a circuit where RC component combination, this time represented by resistor 70 and capacitor 72 act as a low pass filter, and then the output of the filter is digitized by an analog to digital converter 74 before being passed to a processing block 76 in order to output an estimate of a measured current as detected by the Rogowski coil 2. As noted before, the problem exists that the estimate of current depends on the transfer function of the RC filter. It is therefore highly desirable to know the RC product of the resistor 70 and capacitor 72. The Rogowski coil may be replaced by an air-cored current transformer with a burden resistor.

As noted before, capacitors and resistors can be matched exceptionally well within an integrated circuit or reasonably well when collocated as discreet passive components from the same manufacturer outside the IC Therefore, one approach is to form replica copies of the capacitor 72 and the resistor 70 in a circuit which is intended to characterize the RC response. As such the circuit, here generally designated 100, can be regarded as a characterization circuit. In the embodiment shown in FIG. 9 the characterization circuit comprises three replica capacitors 72a, 72b and 72c and three replica resistors 70a, 70b and 70c arranged to introduce phase shifts within a feedback loop of an operational amplifier 102. Each stage in this network is required to insert a phase shift of 60°, and it can be shown, either by analysis or by reference to text books that $$F_r = \frac{1}{2\pi RC\sqrt{2N}}$$ Equation 3 where all the resistors 70a to 70c=R
all the capacitors 72a to 72c=C
N=number of stages
$F_r$=resonance frequency Thus the self-sustaining oscillator within the characterization circuit 100 has a frequency which is reliably related to the RC time constant of the capacitors 72 and resistors 70 within the filter 15. An output from the oscillator can be digitized by an analog to digital converter 110 and then processed by the processor 76 to accurately determine the frequency of operation. The values of the capacitors in the characterization circuit 100 do not necessarily need to be the same as the values of the capacitors in the filter circuit 15. Thus smaller capacitors may be used resulting in a higher oscillation frequency which takes less time to accurately characterize. Similarly the resistors can also be smaller. Thus the characterization circuit need not take up such a significant amount of die area as the filter.

Figure 10:
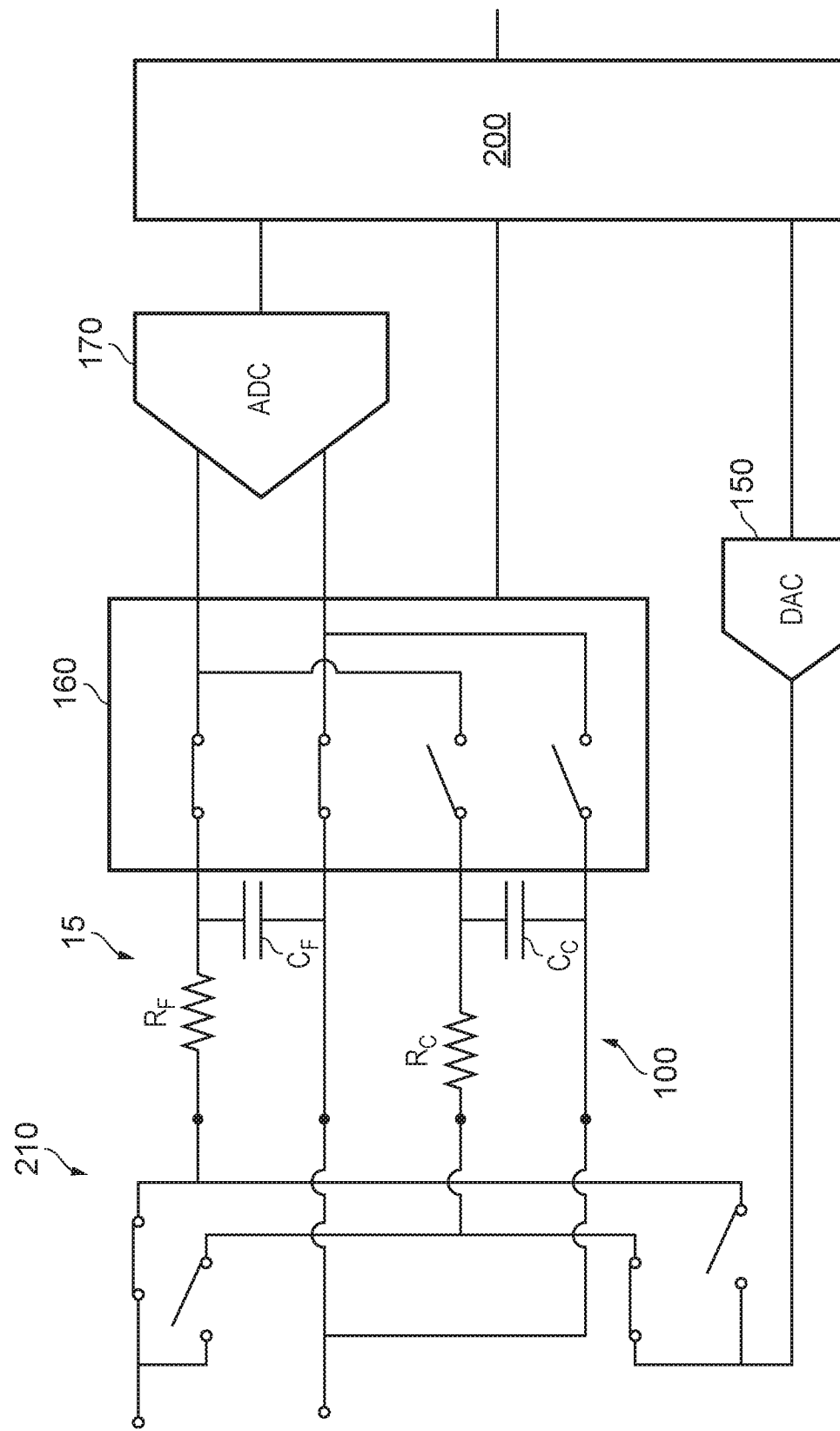
FIG. 10 shows a further embodiment.

As an alternative, both the filter 15 and the characterization circuit 100 may be fabricated to have identical R and C components, as shown in FIG. 10. Here the filter components are designated as $R_f$ and $C_f$ and the corresponding filter in the characterization circuit is designated $R_c$ and $C_c$ with the intention that $R_F=R_c$ and $C_F=C_c$. The filter within the characterization circuit 100 may be driven with an oscillating signal with a digital to analog converter 150 and the output of the filter may be provided by way of a multiplexer 160 to an analog to digital converter 170. The control signals to the digital to analog converter 150 and the results from the analog to digital converter 170 may stem from and be provided to a processor 200. As a consequence the processor 200 can accurately characterize the response of the RC circuit within the characterization circuit 100. Additionally, if required, an array of switches acting to form a swapping circuit 210 may be provided such that the input signal can be swapped to the filter formed by $R_c$ and $C_c$ and that the DAC 150 may be used to drive the filter formed by $R_f$ and $C_f$. Thus, from time to time functionality of the filter 15 and the characterization circuit 100 can be swapped such that each can be accurately characterized and then drift in one of the circuits can be used to compensate for a corresponding drift to the other one of the circuits. By knowing the correct RC time constant then the gain/attenuation and phase shift provided by the filter, irrespective of the filter configuration or number stages can be quickly calculated thereby allowing a circuit, such as a current measuring circuit, to be characterized to a required accuracy even though the absolute values of the resistors and capacitors used within the filter may vary by 20 or more percent from product to product.

Figure 11:
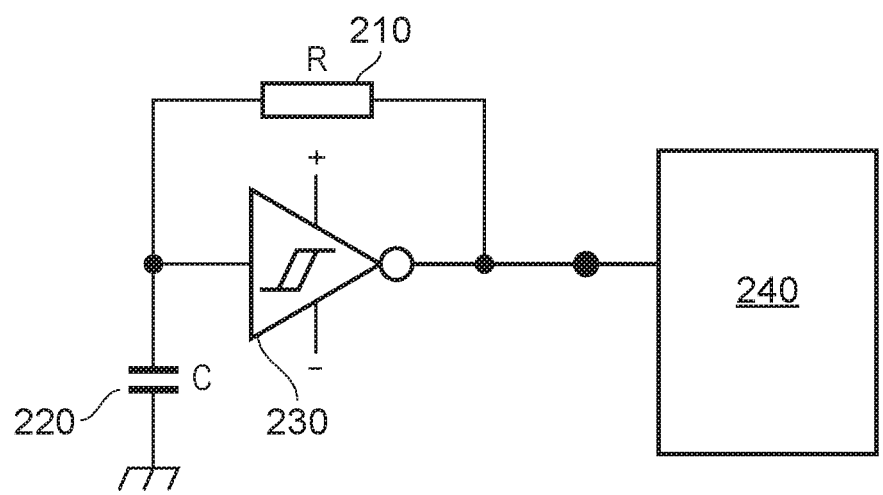
FIG. 11 illustrates a further embodiment of an oscillator.

The characterization need not require multiple copies of the RC filter to form an oscillator. FIG. 11 shows an oscillator circuit where a resistor 210 and a capacitor 220 are provided in a feedback loop around a Schmidt inverter 230 so as to form an oscillator. The output of the inverter 230 is a square wave which as a logic signal can be monitored directly by a processor 240 so as to estimate the frequency of the square wave. Alternatively the output of the inverter may be provided to an ADC to digitize it, or to a logic circuit, such as a divide by two counter, to clean its edges and equalize the mark-space ratio thereof prior to having the frequency of the signal estimated.

Once the data processor can determine the actual response of the low pass filter it can apply a gain correction. Thus supposing that the RC component as measured by the oscillator drifted upwardly by 1% as a result of ambient or other temperature change, and that corresponded to the measured output being X % higher at the measurement frequency (mains frequency) then a corresponding attenuation can be introduced into the signal chain to compensate for the RC drift.

Thus the estimate of current can be corrected.

In the context of Rogowski coil (or air-cored current transformer) based current consumption meters (or watt-hour meters) this approach can be used to improve their performance. Thus approach may be used in conjunction with techniques described in WO2013/038176, "current measurement", which is incorporated herein by reference, where a known additional current can be superimposed on a load current, and then the response of the measurement transducer and associated signal processing chain is examined to deduce the transfer function of the measurement transducer and signal processing chain, or at least to monitor for changes in the transfer function.

The teachings disclosed herein can be used with an $$\frac{dI}{dt}$$

based transducer and integrator combination to monitor for response changes due to heating or aging, and/or to allow correction factors to be calculated and applied, or component values to be electronically trimmed where, for example, the capacitor is made of a plurality of smaller capacitors and associated switches for selectively removing or adding capacitors into a group of capacitors.

The monitoring of the integrator response by a replica characterization circuit can be applied in many areas of technology, such as motor control, automotive, aerospace and medical systems, metering and protective systems (relays and circuit breakers) and the like.

The filter 15 (see FIG. 9) by its nature introduces a delay in processing the input signal, and this can be disadvantageous if some remedial action needs to be taken on an urgent basis, for example to apply protective measures in the event of an overcurrent or overvoltage event. In such an arrangement the signal from the air core current transformer or Rogowski coil may be provided directly to a protection circuit without passing through the low pass filter such that the protection circuit can make a decision about initiating a protective action as quickly as possible.

Once a filter response is characterized the filter can be used to help estimate other parameters such as a magnitude of a surge current or surge voltage. The RC filter provides a linearization of the frequency response from the Rogowski coil or similar inductor based current transducer. In normal operation the output of the filter will be a sinusoid. However in the event of an electrostatic discharge event, such as a lightning strike on a power distribution system, current surges may be caused to flow. The magnitude of a current surge at any point in the distribution system may vary as a function of distance from the point of the lightning strike, and may also depend on the number of intervening current splitting nodes or devices such as transformers. The surge current will be a largely unidirectional event and hence the voltage on the capacitor may become elevated, and then decay away in an exponential manner as set out by:

$$V(t)=Vs\ \exp(-t/RC) \qquad \text{Equation 4}$$

Where $V(t)$ is the voltage at time t after the surge event at $T_0$, and

Vs is the surge voltage at time $T_0$

By examining the evolution of V(t) as a function of time, and with some estimate of elapsed time since the surge event occurred, it becomes possible to estimate the magnitude of the surge current. This requires knowledge of the RC time constant of the filter, but this information becomes available as a result of the operation of the present disclosure. The value Vs may also depend on the duration of the surge event. The duration may be measured by a circuit that runs a counter-timer to time the duration for which the signal exceeds a threshold, or the duration of the surge event, such as lightning strike, may be assumed to be constant.

Figure 12:
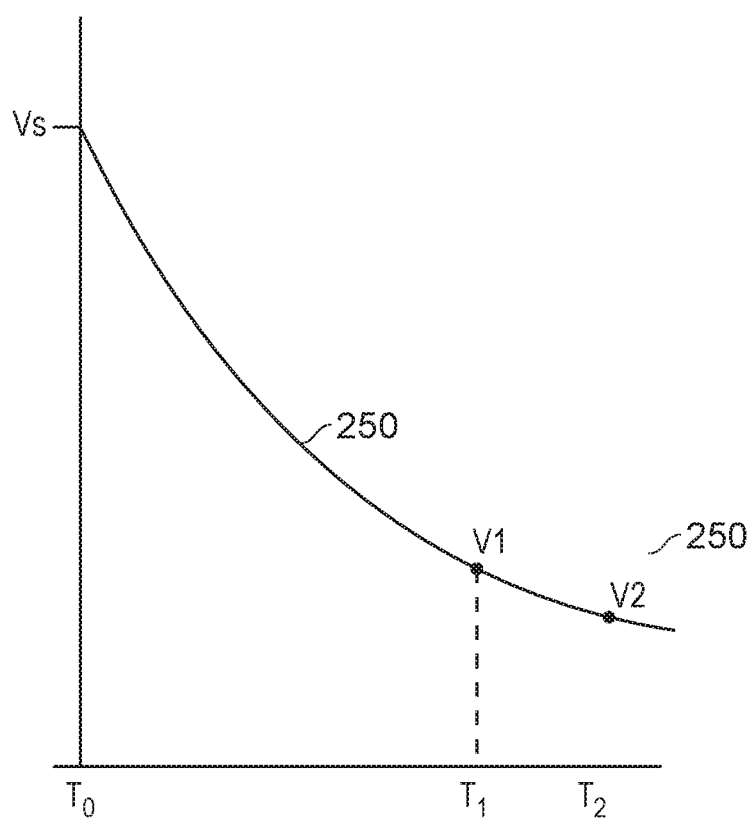
FIG. 12 illustrates the evolution of voltage across the capacitor as a function of time in response to a surge event.

FIG. 12 shows the evolution as a function of time of the voltage stored on the capacitor 26 of FIG. 3 following the occurrence of a surge current and as the voltage decays away. For the purposes of illustration the sinusoidal response from the filter has been omitted but if a mains-borne current is being detected then the sinusoidal response thereof will be superimposed on the exponential decay, represented by line 250 of the voltage across the capacitor.

If the time $T_0$ of the surge event can be captured by a detector, such as by a voltage monitoring circuit that connects directly to the sensor or to some other arrangement that detects the voltage or current spike of the surge (or the occurrence of its peak value within the filter) and the elapsed time to $T_1$, where the voltage is measured is known, then by knowledge of the RC time constant the surge voltage $V_s$ at time $T_0$ can be calculated. The accuracy of timing can be verified or improved by taking further voltage measurements, such as V2 at time $T_2$. The measurements can then be fitted to an appropriate function, such as an exponential delay or to a sync function. Thus an estimate of the energy in the surge event may be made.

If desired, multiple RC filters having different time constants could be used to the evolution of their respective decay voltages as a function of time should intersect at the time of the surge event.

Figure 13:
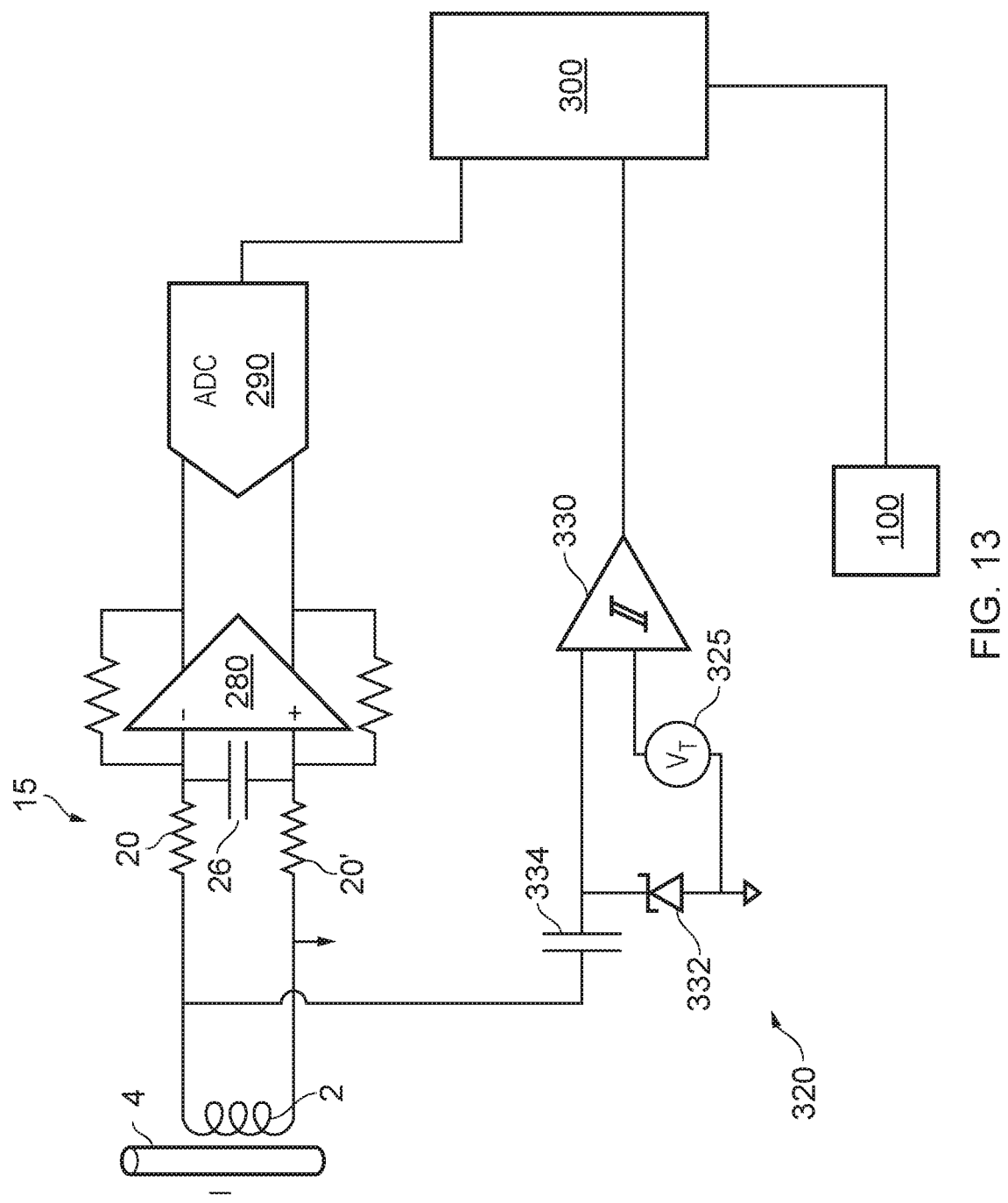
FIG. 13 illustrates a further embodiment of the present disclosure.

FIG. 13 schematically illustrates a further embodiment of the present disclosure. As with the earlier Figures, a current carrying conductor 4 is associated with an inductive sensor 2, such as a Rogowski coil. A voltage developed across the Rogowski coil is filtered by a low pass filter comprising the resistors 20, 20' and the capacitor 26. The low pass filter is, in this embodiment, provided as a differential filter at the input to a difference amplifier 280. An output of the difference amplifier 280 is provided to a differential ADC 290 which converts the differential output of the difference amplifier 280 into a digital code. Thus, the operation of this circuit is analogous to that described with respect to FIG. 9 except that it is fully differential. The time constant of the filter 15 can be estimated by a data processor 300 responsive the output of the characterization circuit 100. The characterization circuit may be formed as described hereinbefore.

In normal use the data processor 300 is responsive to the output of the ADC 290 so as to estimate the alternating current carried by the conductor 4.

The arrangement shown in FIG. 13 is further modified by the inclusion of a transient event detector, generally designated 320 which acts to monitor the output voltage across the Rogowski coil and if it exceeds a target value, as set by voltage source 325 outputting the voltage $V_t$, then a digital signal is output by a comparator 330 indicating that the transient event may be occurring. This gives a timing reference equivalent to time stamping the time $T_0$ of FIG. 12, and may also allow the duration of the surge event to be estimated. The data processor 300 can then monitor the evolution of the voltage across the capacitor 26 as a function of time. Based on the evolution of this voltage, together with an estimate of the RC time constant the data processor 300 can estimate the magnitude of the surge. This is useful as it is indicative of whether components in, for example, an electricity distribution system are likely to have been damaged by the surge event or whether the surge event was within their current handling capability. The comparator 330 may be protected by way of a voltage clamp, schematically illustrated by way of zener diode 332. The transient detector 320 may also include a DC blocking capacitor 334 to provide further protection against transient events.

The circuits have been described with respect to characterizing an RC filter, but the teachings apply equally to characterizing RL or LC filters.

Although the teachings have been presented with respect to inductive current transducers, the teachings relating to estimating the transfer function of a filter or circuit, and using this to estimate the magnitude of a surge current can be applied to estimating the size of over-voltage events or any other measured exception that is converted into the electrical domain by a suitable transducer.

It is thus possible to provide a method and apparatus for accurately characterizing the filter response where the values of the filter are not well known, but the change in their value can be accurately matched to the change in values in a corresponding interrogation circuit.

The techniques discussed herein are applicable components formed in integrated circuits where components can be matched with great accuracy. The techniques can also be applied to discrete components, but some form of preselection to find appropriately matched components may be required.

The claims presented herein are in single dependency format suitable for filing at the USPTO. However it is to be understood that the claims are intended to depend on any preceding claim of the same type except where that is clearly technically infeasible. Thus converting these claims from single dependency to multiple dependency format is not intended to introduce any added matter.

The invention claimed is:

1. An apparatus for estimating a gain error resulting from a position of a pole or a zero in a transfer function of a filter having at least one of a pole or a zero in a filter transfer function of the filter, the apparatus comprising:

a characterization circuit comprising resistor (R) and capacitor (C) components matched to the filter to provide a characterization circuit transfer function such that there is a predictable relationship between a position of at least one pole or zero in the characterization circuit transfer function and the filter transfer function, and wherein the characterization circuit and the filter share at least one of a temperature or a manufacturing process variation; and a processing circuit arranged to interrogate a performance of the characterization circuit and to estimate a correction value for a filter response of the filter based on an attenuation factor of the filter at a particular frequency as determined using a time constant of the R and C components of the characterization circuit.

2. The apparatus as claimed in claim 1, in which the filter is a low pass RC filter.

3. The apparatus as claimed in claim 1, in which the filter is a leaky, integrator.

4. The apparatus as claimed in claim 1, in which the characterization circuit comprises an oscillator formed of at least one RC stage.

5. The apparatus as claimed in claim 1, in which the characterization circuit comprises a further filter, and a signal generator to provide a test signal to the further filter.

6. The apparatus as claimed in claim 5, in which the signal generator is one of
a) a free running oscillator providing an oscillator signal set to a nominal oscillation frequency such that a comparison of the oscillator signal and an output of the further filter allows the frequency of a pole or zero of the further filter to be identified with a desired accuracy;
b) a digital to analog converter driven so as to provide the test signal.

7. The apparatus as claimed in claim 1, in which the filter comprises R and C components, where a fabrication process is the same for the R and C components of the characterization circuit and are notionally identical.

8. The apparatus as claimed in claim 1, in which the filter comprises R and C components, where a fabrication process is the same for the R and C components of the filter and the R and C components of the characterization circuit and the respective R and C components are scaled versions of each other.

9. The apparatus as claimed in claim 8, further comprising a swap circuit for swapping the filter and the characterization circuits.

10. The apparatus as claimed in claim 1 coupled to a responsive variable gain amplifier, variable attenuator or multiplier for estimating gain error to apply a correcting gain.

11. The apparatus of claim 1, included in or in combination with an electricity monitoring or measurement system.

12. A method of correcting for a gain error resulting from a position of a pole or a zero in a transfer function of a signal processing first circuit to process an input signal, the method comprising:
providing a characterization circuit including RC, RL, or LC circuits formed therein respectively having identical or scaled versions of corresponding RC, RL or LC circuits in the first circuit such that transfer functions of the first circuit and the the characterization circuit are related;
providing a second circuit for interrogating a performance of the characterization circuit, to determine a time constant of the characterization circuit; and
using the determined time constant of the characterization circuit, determining or adjusting a transfer function of the first circuit.

13. The method as claimed in claim 12, wherein adjusting the transfer function of the first circuit comprises calculating a deviation of the transfer function of the first circuit from a nominal transfer function, and making said calculation available for correcting an output of the first circuit.

14. The method as claimed in claim 12, further comprising driving the characterization circuit with a known test signal and monitoring an output of the characterization circuit so as to estimate a transfer function of the characterization circuit.

15. A current measuring circuit for characterizing a low pass RC filter, the current measuring circuit comprising:
an air-core current transducer;
an apparatus for estimating a response of the RC filter, for calculating an attenuation provided by the filter at a frequency;
a second circuit comprising at least one RC circuit matched to the RC filter to share at least one of a temperature or manufacturing process variation; and
a circuit for interrogating a performance of the second circuit so as to characterize an RC time constant within the second circuit and to use a result of the characterization to calculate or modify an output of the filter.

16. The current measuring circuit as claimed in claim 15, further comprising a surge detector, and a processor arranged to monitor an evolution of voltage over time, using the characterization of a transfer function of the RC filter to estimate a magnitude of a surge.

17. The current measuring circuit as claimed in claim 16, in which the surge detector is connected upstream of the RC filter.

18. A surge estimator comprising:
a transient event detector, for measuring an output voltage or a current, the transient event detector connected to a comparator configured to provide a time stamp indicating a start of a surge event;
a filter for filtering an output of the transient event detector, the filter having a filter circuit transfer function;
a characterization circuit for estimating the transfer function of the filter, wherein the characterization circuit comprises matched components to the filter to provide a characterization circuit transfer function such that there is a predictable relationship between a position of at least one pole or zero in the characterization circuit transfer function and the filter circuit transfer function;
a circuit for interrogating a performance of the characterization circuit associated with an air-core current transducer to determine a time constant of the characterization circuit; and
a processor responsive to the output of the filter and the characterization circuit for estimating a magnitude of a surge event.

19. The surge estimator as claimed in claim 18, wherein the filter is an RC filter, and the characterization circuit further comprises additional R and C components scaled by a known scaling factor to the R and C components component of the RC filter.

* * * * *

UNITED STATES PATENT AND TRADEMARK OFFICE
CERTIFICATE OF CORRECTION

| | |
|---|---|
| PATENT NO. | : 11,125,784 B2 |
| APPLICATION NO. | : 16/007551 |
| DATED | : September 21, 2021 |
| INVENTOR(S) | : Jonathan Ephraim David Hurwitz |

Page 1 of 1

It is certified that error appears in the above-identified patent and that said Letters Patent is hereby corrected as shown below:

On the Title Page

Item (54) and in the Specification, in Column 1, Line 3, in "Title", delete "OF" and insert --OR-- therefor In the Claims In Column 11, Line 10, in Claim 3, delete "leaky," and insert --leaky-- therefor In Column 11, Line 54, in Claim 12, delete "the the" and insert --the-- therefor Signed and Sealed this
Fourteenth Day of December, 2021

Drew Hirshfeld
*Performing the Functions and Duties of the*
*Under Secretary of Commerce for Intellectual Property and*
*Director of the United States Patent and Trademark Office*